United States Patent [19]

Addis et al.

[11] 3,710,270

[45] Jan. 9, 1973

[54] LINEAR GAIN CONTROL

[75] Inventors: John L. Addis; Ronald W. Peltola, both of Portland, Oreg.

[73] Assignee: Tektronix, Inc., Beaverton, Oreg.

[22] Filed: July 28, 1970

[21] Appl. No.: 58,813

[52] U.S. Cl. ........................330/29, 330/35, 307/304

[51] Int. Cl. ..............................................H03g 3/30

[58] Field of Search ...................330/35, 29; 307/304

[56] References Cited

UNITED STATES PATENTS

| | | | |
|---|---|---|---|
| 3,378,779 | 4/1968 | Priddy | 330/35 X |
| 3,449,683 | 6/1969 | Gale | 330/35 X |

*Primary Examiner*—Nathan Kaufman

*Attorney*—Buckhorn, Blore, Klarquist and Sparkman

[57] ABSTRACT

The gain of an amplifier is controlled by the source-drain impedance of a first field effect transistor having its gate terminal connected to the gate of a second and substantially similar field effect transistor. The second field effect transistor has its source-drain circuit connected in a bridge circuit also including a potentiometer with an adjustable tap providing voltage variations for unbalancing the bridge output. The bridge output operates a differential operational amplifier connected to drive the second field effect transistor for restoring bridge balance. The source-drain impedance of the second field effect transistor, and hence the source-drain impedance of the first field effect transistor, are thereby controlled in proportion to the setting of the aforementioned potentiometer, for adjusting amplifier gain.

9 Claims, 1 Drawing Figure

PATENTED JAN 9 1973 3,710,270
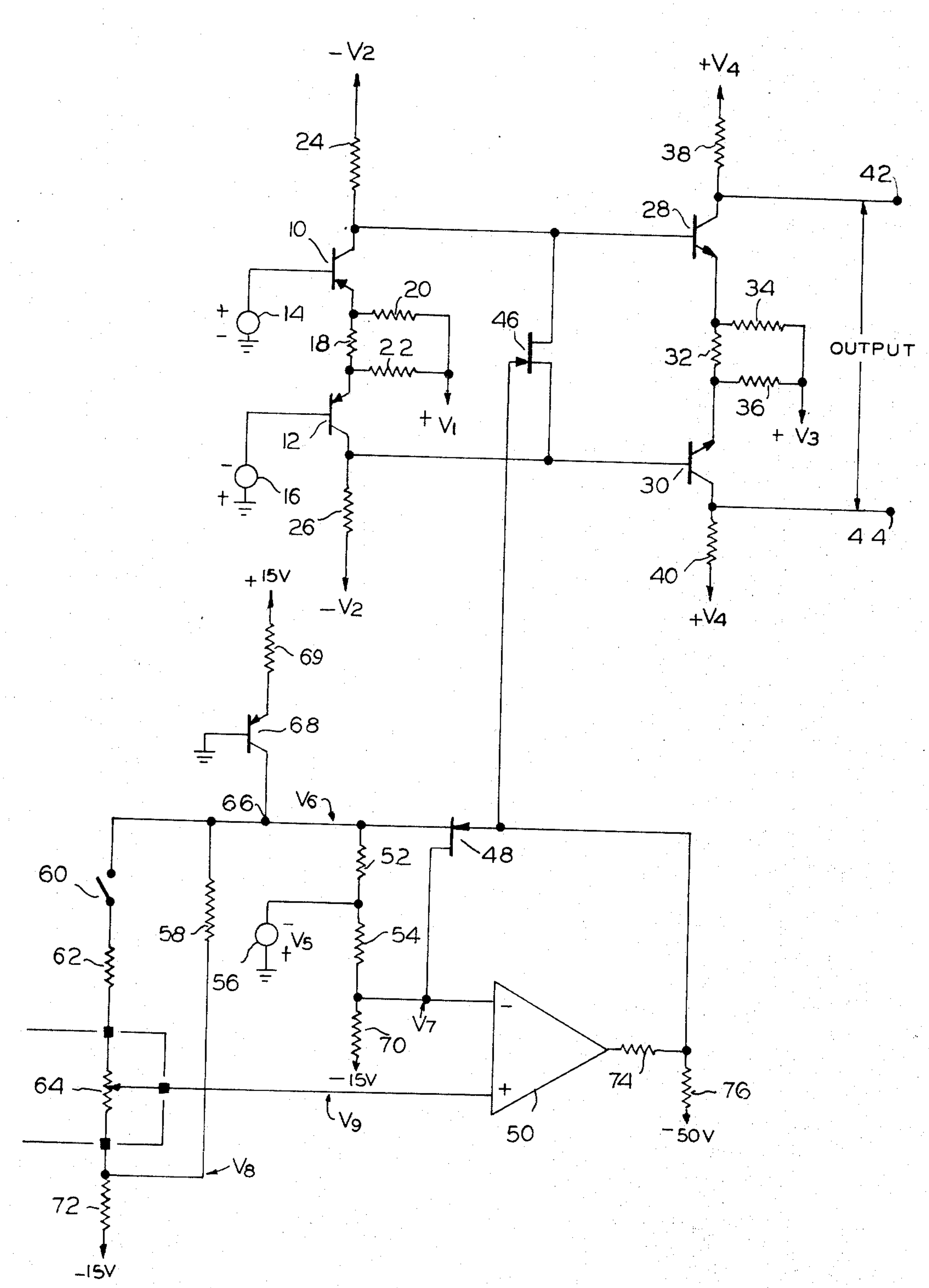
JOHN L. ADDIS
RONALD W. PELTOLA
INVENTORS.
BY
BUCKHORN, BLORE, KLARQUIST & SPARKMAN
ATTORNEYS

LINEAR GAIN CONTROL

BACKGROUND OF THE INVENTION

It is not always convenient to provide a conventional gain control at a given location in an amplifier circuit where a variable impedance is electrical desirable for varying gain. Thus, a conventional gain control or potentiometer is suitably located on the front panel of an apparatus, and the provision of an electrical connection from such front panel to an amplifier is generally inconvenient, or impossible in the case of wideband amplifiers and the like. Also, of course, the provision of an extended mechanical connection may be cumbersome and undesirable.

SUMMARY OF THE INVENTION

According to the present invention, a field effect transistor operating below pinch off voltage is employed as the immediate impedance-varying element for changing the gain of an amplifier. The field-effect transistor functions as a purely resistive element which is externally controllable, the field effect transistor thereby providing a function which has heretofore been very difficult to achieve. Because the field effect transistor's gate potential in the present circuit is essentially unchanging with respect to the amplifier signal, and because the drain and source operate indistinguishably from each other, the field effect transistor is a linear "resistor" over a large range of signal voltage swings.

Also according to the present invention, linear control of the field effect transistor is achieved. Ordinarily, a field effect transistor is temperature sensitive and its resistance is a non linear function of the control voltage at its gate. According to the present invention, the impedance of the field effect transistor is controlled by means of a second field effect transistor having its gate terminal connected to the gate terminal of the first field effect transistor. The drain-source circuit of the second field effect transistor is connected in a bridge circuit and the bridge output drives a differential amplifier. If the bridge is unbalanced, the gate of the second field effect transistor is driven to provide for adjustment of the source-drain impedance. In this manner, the source-drain impedance of the second transistor is forced to follow proportionately changes in a control input device connected to the bridge, regardless of inherent non linearities, temperature changes, and the like. Since the second field effect transistor is thus controlled, the first field effect transistor is similarly controlled. Consequently, linear control of the amplifier gain is achieved.

It is an object of the present invention to provide an improved variable resistance means.

It is another object of the present invention to provide an improved variable resistance means wherein the output resistance or impedance is linear and linearly proportional to a control input.

It is another object of the present invention to provide an improved amplifier gain control effective with minimal change in amplifier transient response and with minimal gain changes as a function of temperature.

It is another object of the present invention to provide an improved and linear gain control which is remotely controllable.

The subject matter which we regard as our invention is particularly pointed out and distinctly claimed in the concluding portion of this specification. The invention, however, both as to organization and method of operation, together with further advantages and objects thereof, may best be understood by reference to the following description taken in connection with the accompanying drawing wherein like reference characters refer to like elements.

DRAWING

The FIGURE of the drawing is a schematic diagram of an amplifier and gain control circuit according to the present invention.

DETAILED DESCRIPTION

Referring to the drawing, a multi stage, push-pull amplifier includes a first stage comprising PNP transistors 10 and 12 having their base terminals coupled to symmetrical signal sources 14 and 16, respectively. Unbypassed resistors 20 and 22 disposed between the transistor emitters and voltage $+V_1$ provide innercoupling between the transistor emitters, together with resistor 18 connected therebetween. A resistor 24 connects the collector of transistor 10 to a voltage $-V_2$, and the resistor 26 is similarly interposed between the collector transistor 12 and the same voltage.

The push-pull stage drives a second push-pull stage comprising NPN transistors 28 and 30 having their emitters interconnected by the resistor 32, 34, 36 circuit, and having their collectors returned to a voltage $=V_4$ by way of resistors 38 and 40 respectively. Terminals 42 and 44 are connected to the collectors of transistors 28 and 30 for providing the push-pull output of the circuit.

In accordance with the present invention, a first field effect transistor 46 is provided having its drain and source terminals connected to the collectors of transistors 10 and 12. This field effect transistor is operated below the pinch off voltage as a linear resistor. The gate potential is normally substantially unchanging with respect to the signal appearing at the collectors of transistors 10 and 12, and the drain and source terminals operate indistinguishably from each other permitting the field effect transistor 46 to operate a linear resistor over a large range of signal voltage swings.

The gate of field effect transistor 46 is connected to the gate of field effect transistor 48 as well as to the output of a differential operational amplifier 50. Field effect transistor 48 is desirably substantially identical to field effect transistor 46 and is similarly operated below pinch off voltage. The source-drain circuit of transistor 48 is connected as a part of one arm of a bridge, this arm also including a voltage divider made up of resistors 52 and 54 connected in series between the source and drain terminals of transistor 48. A voltage source 56 is connected between the midpoint of the voltage divider 52, 54 and ground.

A second arm of the aforementioned bridge, arranged to have the same impedance as the first arm, comprises resistor 58 in parallel with the series connection of switch 60, resistor 62, and potentiometer 64, the latter being remotely positionable. The first and second arms of bridge are connected together at common terminal 66 which receives current from the collector of current source transistor 68 having its emitter returned to +15 volts via resistor 69, and its base grounded.

Third and fourth arms of the bridge comprise resistors 70 and 72 having equal resistance values. Resistor 70 is connected from the junction of resistor 54 with the drain terminal of transistor 48 to −15 volts. Resistor 75 connects from the remaining end of potentiometer 64, to a −15 volts. The movable tap of potentiometer 64 provides a variable input voltage value to a positive input terminal of differential operational amplifier 50, while the negative input terminal of amplifier 50 is connected to the drain of field effect transistor 48. The output of amplifier 50 drives the gate terminals of field effect transistors 46 and 48 through series resistor 74, and a resistor 76 returns the common gate terminal connection to a −50 volts.

Considering operation of the circuit, the push-pull amplifier functions in the usual manner with input stage 10, 12 driving output stage 28, 30 to provide push-pull output between terminals 42 and 44. The resistance between the drain and source terminals of field effect transistor 46 is varied according to the present invention in order to vary the gain of the amplifier, by shunting a portion of the output provided between the collectors of transistors 10 and 12 through the field effect transistor 46. The aforementioned bridge circuit is arranged so that it is normally balanced by means of amplifier 50, with amplifier 50 supplying an output to the gate of field effect transistor 48 such that the resistance between the source and drain terminals of field effect transistor 48 balances the bridge.

The bridge is balanced when the movable tap of potentiometer 64 is positioned at the lower end of the potentiometer. As the tap of potentiometer 64 is then changed, amplifier 50 seeks, by affecting the bias at the gate of field effect transistor 48, to maintain negligible voltage between the positive and negative inputs of amplifier 50. Amplifier 50 provides an output for decreasing the source-drain resistance of field effect transistor 48 and of its mate, field effect transistor 46, in proportion to the voltage charge at the amplifier positive input terminal. $V_6$ is the voltage at junction 66, $V_8$ is the voltage at the lower end of potentiometer 64, and $V_9$ is the voltage at the tap. After the potentiometer tap is moved, the impedance of the combination of the source-drain circuit of transistor 48, in parallel with resistors 52 and 54, will decrease. The new impedance of the parallel combination will bear the same ratio to its original impedance as $V_9$ minus $V_6$ bears to $V_8$ minus $V_6$. A linear relationship obtains between the conductance of the parallel combination of transistor 48 and resistors 52 plus 54, and the rotation of potentiometer 64, assuming potentiometer 64 has a linear taper. The gain of the amplifier comprising transistor 10, 12, 28, and 30 is proportional to the same conductance since transistors 46 and 48 are substantially identical. Temperature compensation is accomplished by the nature of the feedback loop present, which operates independent of temperature.

In order to assure correct tracking of the operation of transistors 48 and 46, it is not only desired that the transistors be substantially identical, but also that they be operated under substantially similar conditions. I.E., nearly identical voltages are coupled to the two terminals of a transistor via identical resistances in each case, assuring linear operation. If the field effect transistors were operated with a differing degree of electrode balance, impedance linearity and tracking would be adversely affected, e.g. by electrode capacitances. It is first convenient that resistors 24, 26, 52, and 54 coupled to respective voltage sources be substantially identical in value. Although no appreciable current is drawn from voltage source 56, connected to the junction of resistors 52 and 54, the presence thereof helps assure equal gate to source and gate to drain voltages in transistor 48 which is the situation which obtains for transistor 46 in the amplifier circuit. The source and drain voltages of the field effect transistor 48 will then vary with respect to a predetermined average potential established by voltage source 56. Note that resistors 24 and 26 similarly couple field effect transistor 46 to voltage source $V_2$.

In the case of field effect transistor 46, symmetrical signal swings take place about the gate potential. It is desired that potentials change symmetrically in transistor 48, as well, to preserve linearly identical operation. From the source terminal of transistor 48, a resistance comprising resistor 52 in parallel with the second and fourth arms of the bridge in series to ground is seen. From the drain terminal of transistor 48, a resistance comprising resistors 54 and 70 in parallel to ground will be present. If the resistance from source to ground were not equal to the resistance from drain to ground, then the voltages respectively from source and drain to ground would not change by the same amount during circuit operation. Therefore, the aforementioned resistances seen by source and drain respectively are made substantially equal, in order to preserve circuit operating linearity.

Also, current source transistor 68 is employed for empowering the bridge circuit and providing the necessary operating voltages for transistor 48 and potentiometer 64 as well as amplifier 50, so that circuit operation will be little affected by such input source. Current source transistor 68 has a relatively high impedance compared with the other resistances present. Use of current source 68 thus assures that the resistance to ground from the source of transistor 48 equals the resistance to ground from the drain of transistor 48, this being necessary if the gate source and gate to drain voltages of transistor 48 are to remain equal.

Ideally if components had exact values, if the bridge were perfectly balanced, and if current source 68 had an infinite impedance, the voltage source 56 would not be necessary. However, in a practical circuit the voltage source 56 assures the source and drain of transistor 48 operate symmetrically with respect to the gate in order to match transistor 46 and provide symmetrical and linear operation of field effect transistor 48. Symmetrical operation is particularly important, of course, in the case of a push-pull amplifier circuit. It is intended that $V_5$ equal the average of the voltages appearing at the collectors of transistors 10 and 12.

Switch 60 is normally closed. When open, this switch assures that voltage $V_9$ will be more negative than $V_7$ thus biasing off both field effect transistors. Gain is then independent of the field effect transistors to attain a "calibration" condition.

There is thus provided, according to the present invention, a linear gain control wherein resistance is linear and linearly proportional to a control input. Moreover, the resistance is remotely controllable and doesn't interfere with wideband amplifier operation. There is a minimal change in amplifier transient response with gain control operation, and minimal gain change as a function of temperature.

While we have shown and described a preferred embodiment of our invention, it will be apparent to those skilled in the art that many changes and modifications may be made without departing from our invention in its broader aspects. We therefore intend the appended claims to cover all such changes and modifications as fall within the true spirit and scope of our invention.

We claim:

1. Impedance control apparatus for controlling the impedance between two terminals comprising:

- a first field effect transistor having its source and drain connected between said terminals for providing a variable impedance therebetween in response to a control signal applied to the gate of said first transistor;
- a second substantially identical field effect transistor having its gate connected to the gate of said first transistor and providing in response to said control signal a second variable impedance substantially the same as said impedance between said terminals;
- means including controllable reference impedance for producing a controllable references signal:
- comparison means for comparing an output signal from said second impedance with said controllable reference signal and producing said control signal in response to said comparison to change said second impedance in proportion to the change in said reference impedance and change the impedance between said terminals in proportion to said change in said reference impedance.

2. The apparatus according to claim 1 wherein said comparison means includes a bridge circuit comprising a first arm including said second impedance, a second arm including said controllable reference impedance and third and fourth arms of a constant impedance, and said comparison means also includes a differential amplifier whose input terminals are connected to the common junctions of the first and fourth arms and the second and third arms, and whose output terminal is connected to the gates of said field effect transistors.

3. Impedance control apparatus for controlling the impedance between two terminals comprising:

- a first field effect transistor having its source and drain connected between said terminals for providing a variable impedance therebetween in response to a control signal applied to the gate of said first transistor;
- a second substantially identical field effect transistor having its gate connected to the gate of said first transistor and providing in response to said control signal a second variable impedance substantially the same as said impedance between said terminals;
- a means for producing controllable reference voltage;
- means for comparing the voltage between the source and drain of said second transistor with said controllable reference voltage and producing said control signal in response to said comparison to change said second impedance in proportion to the change in said reference voltage to thereby change the impedance between said terminals in proportion to said change in said reference voltage.

4. The apparatus according to claim 3 wherein said means for comparing said controllable reference voltage with the voltage between the source and drain of said second field effect transistor includes a bridge circuit having the source drain circuit of said second field effect transistor in a first arm thereof, and an impedance from which said controllable voltage is derived in a second arm thereof.

5. The apparatus according to claim 3 wherein said means for comparing includes a differential amplifier having its output connected in driving relation to the gates of said field effect transistors, having one input thereof coupled to the source drain circuit of said second field effect transistor and having a second input terminal thereof coupled to receive said controllable reference voltage.

6. The apparatus according to claim 4 further including a current source for providing current to said bridge circuit, said current source being coupled to the arms of said bridge including the source-drain circuit of said second field effect transistor and the impedance from which said controllable voltage is derived.

7. The apparatus according to claim 4 wherein said bridge circuit includes third and fourth arms completing said bridge circuit by returning said first and second arms to a predetermined potential point.

8. The apparatus according to claim 4 wherein the said arm of said bridge including the source-drain circuit of second field effect transistor further includes a voltage divider disposed between the source and drain of said second field effect transistor and a voltage source connected to an intermediate point on said voltage divider for determining the average potential with respect to which the source and drain voltages of said second field effect transistor may vary.

9. The apparatus according to claim 3 wherein said amplifier is a push-pull amplifier having the source-drain circuit of said field effect transistor coupled between balanced signal paths in said push-pull amplifier,

- and means for balancing voltage and impedance values between the source and drain of said second field effect transistor to maintain balanced operation thereof.

* * * * *